(12) United States Patent
Moon et al.

(10) Patent No.: US 9,391,039 B2
(45) Date of Patent: Jul. 12, 2016

(54) SOLDER BALLS AND SEMICONDUCTOR DEVICE EMPLOYING THE SAME

(71) Applicant: MK Electron Co., Ltd., Gyeonggi-do (KR)

(72) Inventors: Jeong Tak Moon, Gyeonggi-do (KR); Jae Yeol Son, Gyeonggi-do (KR); Santosh Kumar, Gyeonggi-do (KR); Eung Jae Kim, Daegu (KR); Hui Joong Kim, Seoul (KR); Ho Gun Cha, Daejeon (KR)

(73) Assignee: MK Electron Co., Ltd. (KR)

( * ) Notice: Subject to any disclaimer, the term of this patent is extended or adjusted under 35 U.S.C. 154(b) by 0 days.

(21) Appl. No.: 14/446,788

(22) Filed: Jul. 30, 2014

(65) Prior Publication Data

US 2015/0380373 A1    Dec. 31, 2015

(30) Foreign Application Priority Data

Jun. 30, 2014    (KR) .......................... 10-2014-0081222

(51) Int. Cl.
*H01L 23/48* (2006.01)
*H01L 23/00* (2006.01)
*H01B 1/02* (2006.01)

(52) U.S. Cl.
CPC ................ *H01L 24/17* (2013.01); *H01B 1/026* (2013.01); *H01L 2224/13012* (2013.01); *H01L 2224/13016* (2013.01); *H01L 2224/13111* (2013.01); *H01L 2224/13647* (2013.01); *H01L 2224/16113* (2013.01); *H01L 2224/16157* (2013.01); *H01L 2224/16225* (2013.01); *H01L 2924/014* (2013.01); *H01L 2924/01029* (2013.01); *H01L 2924/01047* (2013.01); *H01L 2924/01327* (2013.01); *H01L 2924/207* (2013.01); *H01L 2924/2075* (2013.01); *H01L 2924/20751* (2013.01)

(58) Field of Classification Search
CPC ........ H01L 33/62; H01L 23/488; H01L 24/66
USPC .......................................................... 257/778
See application file for complete search history.

(56) References Cited

U.S. PATENT DOCUMENTS

| 2014/0183733 A1 | 7/2014 | Chu et al. |
| 2015/0208509 A1 * | 7/2015 | Sakai ....................... H05K 1/18 |
| | | 361/751 |

FOREIGN PATENT DOCUMENTS

| JP | 4488642 B2 | 10/2002 |
| JP | 5036265 B2 | 9/2007 |
| JP | 2007235091 (A) | 9/2007 |
| KR | 100792663 (B1) | 1/2008 |
| WO | WO20121067202 (A1) | 5/2012 |

* cited by examiner

*Primary Examiner* — Elias M Ullah
(74) *Attorney, Agent, or Firm* — Brinks Gilson & Lione

(57) ABSTRACT

A solder ball and a semiconductor device using the same are provided. In a Sn-based solder ball in which a first plating layer and a second plating layer are sequentially formed on a core ball, the second plating layer includes a Sn—Ag—Cu alloy, and $Ag_3Sn$ intermetallic compound (IMC) nanoparticles or Ag—Sn compound nanoparticles exist in the second plating layer. The solder balls have high sphericity and stand-off characteristics and connection reliability so that a semiconductor device having a high degree of integration may be implemented.

11 Claims, 8 Drawing Sheets

SOLDER BALLS AND SEMICONDUCTOR DEVICE EMPLOYING THE SAME

CROSS REFERENCE TO RELATED APPLICATION

This application claims priority under 35 U.S.C. §119 to Korean Patent Application No. 10-2014-0081222, filed on Jun. 30, 2014, in the Korean Intellectual Property Office, the disclosure of which is incorporated herein in its entirety by reference.

FIELD OF THE INVENTION

One or more embodiments relate to solder balls and a semiconductor device employing the same, and more particularly, to solder balls having high sphericity and stand-off characteristics and thus, having high connection reliability and a semiconductor device having a high degree of integration.

BACKGROUND

As electronic products are required to be downsized and have high performance, semiconductor devices mounted on a substrate are downsized and the number of terminals is increasing. Therefore, the terminals are required to be downsized and integrated.

As solder balls are downsized, it is difficult to maintain sphericity and it is required to prevent solder balls from being bridged and to reliably connect the substrate and the semiconductor devices. Therefore, it is required to improve material characteristics of the solder balls.

SUMMARY

Solder balls are provided having high sphericity and stand-off characteristics and thus, having high connection reliability.

One or more embodiments include a semiconductor device employing the solder balls and thus, having a high degree of integration.

Additional aspects will be set forth in part in the description which follows and, in part, will be apparent from the description, or may be learned by practice of the presented embodiments.

According to one or more embodiment, there is provided a Sn-based solder ball in which a first plating layer and a second plating layer are sequentially formed on a core ball. The second plating layer includes a Sn—Ag—Cu alloy, and $Ag_3Sn$ intermetallic compound (IMC) nanoparticles and/or Ag—Sn compound nanoparticles exist in the second plating layer.

The $Ag_3Sn$ IMC nanoparticles and/or the Ag—Sn compound nanoparticles may be uniformly distributed all over the second plating layer. Diameters of the $Ag_3Sn$ IMC nanoparticles and/or the Ag—Sn compound nanoparticles may be in a range of about 0.06 μm to about 1.8 μm.

Sphericity after reflow of the solder ball may be no less than 0.95. The second plating layer may include Ag in an amount in a range of about 0.5 wt % to about 4 wt % and Cu in an amount of no more than about 1.5 wt %. The second plating layer excludes Cu.

The second plating layer may be formed of Ag in an amount in a range of about 2.5 wt % to about 3.5 wt %, Cu in an amount in a range of about 0.4 wt % to about 1.2wt%, Sn as a remainder, and other inevitable impurities.

The Sn-based solder ball may further include a Sn crystal grain layer on a surface of the second plating layer. An average diameter of Sn crystal grains of the Sn crystal grain layer may be in a range of about 1 μm to about 10 μm.

According to one or more embodiments, there is provided a Sn-based solder ball in which a first plating layer and a second plating layer are sequentially formed on a core ball. The second plating layer includes a Sn—Ag—Cu alloy. Ag—Sn compound nanoparticles exist in the second plating layer. The Ag—Sn compound nanoparticles are formed of Ag in an amount in a range of about 10 wt % to about 90 wt %, Sn in an amount in a range of about 90 wt % to about 10 wt %, and other inevitable impurities.

The Ag—Sn compound nanoparticles may be uniformly distributed all over the second plating layer.

According to one or more embodiments, there is provided a semiconductor device, including a substrate in which a plurality of first terminals are formed, a semiconductor device mounted on the substrate and having a plurality of second terminals corresponding to the plurality of first terminals, and solder bumps for respectively connecting the first terminals and the second terminals. The solder bumps may be the above-described Sn-based solder balls.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
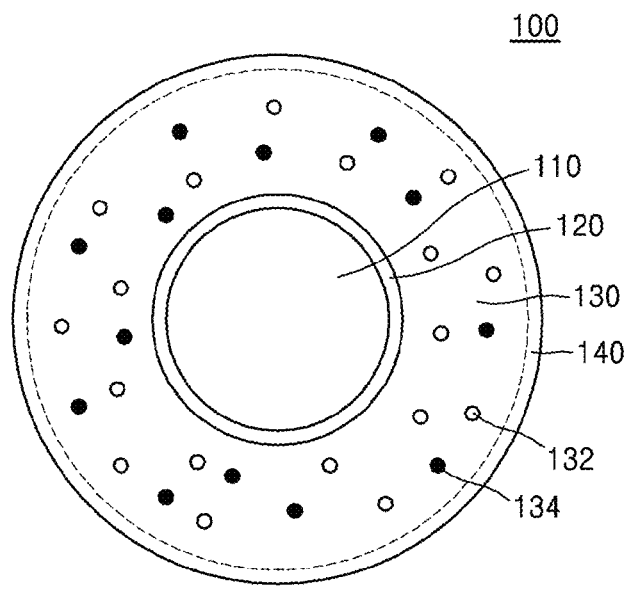
FIG. 1 is a cross-sectional view conceptually illustrating a solder ball according to an exemplary embodiment.

The present embodiments will now be described more fully with reference to the accompanying drawings, in which exemplary embodiments are shown. The same elements in the drawings are denoted by the same reference numerals and a repeated explanation thereof will not be given. The present embodiments may, however, be embodied in many different forms and should not be construed as limited to the exemplary embodiments set forth herein. Rather, these embodiments are provided so that this disclosure will be thorough and complete, and will fully convey the scope of the present embodiments to one of ordinary skill in the art. In the drawings, the thicknesses of elements are exaggerated for clarity.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope of the embodiments.

Unless otherwise defined, terms such as "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Unless otherwise defined, all terms (including technical and scientific terms) used herein have the same meaning as commonly understood by one of ordinary skill in the art.

According to one embodiment, a solder ball sequentially including a first plating layer and a second plating layer is provided.

FIG. 1 is a cross-sectional view conceptually illustrating a solder ball 100 according to an exemplary embodiment.

Referring to FIG. 1, the solder ball 100 in which a first plating layer 120 and a second plating layer 130 are sequentially stacked on a core ball 110 is provided.

The core ball 110 may be formed of a common metal or organic material, an organic/organic composite material, or an organic/inorganic composite material.

For example, the core ball formed of the organic material may be a core ball formed of plastic. The core ball formed of plastic may include a plastic core including a thermo-setting resin, such as epoxys, melamine-formaldehydes, benzoguanamine-formaldehydes, divinylbenzene, divinylether, oligo or polydiacrylate, or alkylenebisacrylamide resin, a plastic core including a thermo-plastic resin, such as polyvinyl chloride, polyethylene, polystylene, nylon, or a polyacetal resin, an elastic core including, for example, natural rubber or synthetic rubber, or a plastic core including a resin obtained by mixing the thermo-hardening resin and the thermo-plastic resin.

On the other hand, the core ball formed of plastic may be formed by a polymer synthesizing method. For example, the core ball may be formed to have a diameter in a range of about 20 µm to about 300 µm by a synthesizing method such as suspension, emulsification, or dispersion polymerization.

The metal material may be, for example, pure copper (Cu) or a Cu alloy.

The first plating layer 120 may be provided on the core ball 110. The first plating layer 120 may be directly formed on the core ball 110 and may be formed on the core ball 110 with another material layer interposed.

A component of the first plating layer 120 is not limited and may be a metal such as gold (Au), silver (Ag), nickel (Ni), zinc (Zn), tin (Sn), aluminum (Al), chromium (Cr), or antimony (Sb). The above metals may be singly used or two or more kinds thereof may be used together. For example, the first plating layer 120 may be commonly formed by a widely known plating method. The first plating layer 120 of the current exemplary embodiment may be formed by an electrolytic plating or non-electrolytic plating method using Ni.

When the first plating layer 120 is formed, in order to reduce roughness of a surface of the first plating layer 120, a brightener may be used. That is, the first plating layer 120 having a smooth surface may be obtained by using the brightener. The brightener may be, for example, an oxygen-containing organic compound, for example, a polyether-based compound such as polyethyleneglycol; a nitrogen-containing organic compound, such as a tertiary amine compound, or a quaternary ammonium compound; and/or a sulfur-containing organic compound that has a sulfonate group. However, the solder balls are not limited thereto.

However, since adhesiveness between the first plating layer 120 and the second plating layer 130 may deteriorate due to the first plating layer 120 the surface of which is made smooth by using the brightener, the brightener may not be used when the first plating layer 120 is formed.

A thickness of the first plating layer 120 may be in a range of about 1 µm to about 5 µm.

The second plating layer 130 may be further formed on the surface of the first plating layer 120.

A component of the second plating layer 130 is not limited and may be a metal such as Au, Ag, Ni, Zn, Sn, magnesium (Mg), Al, Cr, Cu, or Sb. The above metals may be singly used or two or more kinds thereof may be used together. For example, the second plating layer 130 may be formed of Sn or SnAg, SnAgCu, SnCu, SnZn, SnMg, or SnAl that is an alloy including Sn.

When Sn is singly used, a reflow temperature is excessively high due to increase in a melting point. As a result, the lives of semiconductor parts may be reduced. Therefore, Ag and Cu may be added to lower the melting point.

A thickness of the second plating layer 130 may be in a range of about 5 µm to about 50 µm. A volume of the second plating layer 130 may be in a range of about 70% to about 150% of a volume of the core ball 110. When the volume of the second plating layer 130 is too small in comparison with that of the core ball 110, reactivity to pads deteriorates so that missing balls may be generated. To the contrary, when the volume of the second plating layer 130 is too large in comparison with that of the core ball 110, a void may occur in the second plating layer 130 so that thermal conductivity may deteriorate and resistance against dropping and thermal shock may be reduced.

The second plating layer 130 of the current exemplary embodiment may be, for example, a ternary alloy of Sn—Ag—Cu. When the second plating layer 130 is a ternary alloy of Sn—Ag—Cu, Sn, Ag, and Cu may be uniformly distributed in the second plating layer 130. Furthermore, $Ag_3Sn$ intermetallic compound (IMC) nanoparticles 132 and/or Ag—Sn compound nanoparticles 134 may exist.

The $Ag_3Sn$ IMC nanoparticles 132 and/or the Ag—Sn compound nanoparticles 134 may be uniformly distributed in the second plating layer 130. The $Ag_3Sn$ IMC nanoparticles 132 and/or the Ag-Sn compound nanoparticles 134 may be observed by an electron microscope such as a scanning electron microscope (SEM) or a transmission electron microscope (TEM).

An average diameter of the $Ag_3Sn$ IMC nanoparticles 132 may be in a range of about 0.06 µm to about 1.8 µm. The average diameter of the $Ag_3Sn$ IMC nanoparticles 132 may be defined by a length of a longest axis of the observed $Ag_3Sn$ IMC nanoparticles 132. The average diameter of the $Ag_3Sn$ IMC nanoparticles 132 may be obtained by using software having an image processing device.

An average diameter of the Ag—Sn compound nanoparticles 134 may be in a range of about 0.06 µm to about 1.8 µm. The average diameter of the Ag—Sn compound nanoparticles 134 may be defined by an average length of a longest axis of the observed Ag—Sn compound nanoparticles 134. The average diameter of the Ag—Sn compound nanoparticles 134 may be obtained by using software having an image processing device.

The Ag—Sn compound nanoparticles 134 may be formed of Ag in an amount in a range of about 10 wt % to about 90 wt %, Sn in an amount in a range of about 90 wt % to about 10 wt %, and other inevitable impurities. In particular, the Ag—Sn compound nanoparticles 134 may be formed of Ag in an amount in a range of about 50 wt % to about 90 wt %, Sn in an amount in a range of about 50 wt % to about 10 wt %, and other inevitable impurities.

The second plating layer 130 may include Ag in an amount of no less than about 0.5 wt % and no more than about 4 wt %. In addition, the second plating layer 130 may include Cu in an amount of no more than about 1.5 wt %. In one embodiment, the second plating layer 130 excludes Cu.

The second plating layer 130 may be formed of Ag in an amount in a range of about 2.5 wt % to about 3.5 wt %, Cu in an amount in a range of about 0.4 wt % to about 1.2 wt %, Sn as a remainder, and other inevitable impurities.

A Sn crystal grain layer 140 may be further provided on a surface of the second plating layer 130. The Sn crystal grain layer 140 may be a layer formed of Sn crystal grains. An average diameter of the Sn crystal grains may be in a range of about 1 μm to about 10 μm.

The second plating layer 130 may be formed by a widely known plating method. For this purpose, after an Ag stabilizer is added to a plating tub including Sn, Ag, and Cu, current with a low current density of no more than 1 ampere per square decimeter (ASD) is applied to perform electrolytic plating.

Sn concentration in the plating tub for forming the second plating layer 130 may be in a range of about 0.1 M to about 1 M. Ag concentration in the plating tub for forming the second plating layer 130 may be in a range of about 0.005 M to about 0.05 M. Cu concentration in the plating tub for forming the second plating layer 130 may be in a range of about $1 \times 10^{-5}$ M to about $5 \times 10^{-4}$ M.

Concentration of the Ag stabilizer may be in a range of about 0.01 M to about 0.5 M. When the concentration of the Ag stabilizer is too low, distribution of the Ag$_3$Sn IMC nanoparticles 132 or the Ag—Sn compound nanoparticles 134 is non-uniform so that sphericity of bumps formed later may deteriorate. When the sphericity of the bumps deteriorates, since there is high probability that adjacent bumps are bridged, connection reliability may deteriorate. To the contrary, when the concentration of the Ag stabilizer is too high, a composition of a plating solution for forming the second plating layer 130 changes in accordance with a plating time so that a composition of the second plating layer 130 may not be uniform.

On the other hand, the Ag stabilizer may be selected from, for example, an amine compound such as primary amine, secondary amine, or tertiary amine, an ammonium carbamate compound, an ammonium carbonate compound, an ammonium bicarbonate-based compound, a phosphorus compound such as phosphine or phosphate, a sulfur compound such as thiol or sulfide, and a mixture of the above compounds. The amine compound may be, for example, methylamine, ethylamine, n-propylamine, isopropylamine, n-butylamine, isobutylamine, isoamylamine, n-hexylamine, 2-ethylhexylamine, n-heptylamine, n-octylamine, isooctylamine, nonylamine, decylamine, dodecylamine, hexadecylamine, octadecylamine, docodecylamine, cyclopropylamine, cyclopentylamine, cyclohexylamine, allylamine, hydroxyamine, ammonium hydroxide, methoxyamine, 2-ethanolamine, methoxyethylamine, 2-hydroxypropylamine, methoxypropylamine, cyanoethylamine, ethoxyamine, n-butoxyamine, 2-hexyloxyamine, methoxyethoxyamine, methoxyethoxyethoxyethylamine, diethylamine, dipropylamine, diethanolamine, hexamethyleneimine, morpholine, piperidine, piperazine, ethylenediamine, propylenediamine, hexamethylenediamine, triethylenediamine, 2,2-(ethylenedioxy)bisethylamine, triethylamine, triethanolamine, pyrrole, imidazole, benzotriazole, 3-amino-1,2,4-triazole, pyridine, aminoacetaldehydedimethylacetal, 3-aminopropyltrimethoxysilane, 3-aminopropyltriethoxysilane, aniline, anisidine, aminobenzonitryl, benzylamine, or a conductor thereof or a polymer compound such as polyallylamine or polyethyleneimine or a conductor thereof. Examples of the ammonium compound, such as the ammonium carbamate-based compound are ammonium carbamate, ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneimineammonium hexamethyleneiminecarbamate, morpholinium morpholinecarbamate, pyridinium ethylhexylcarbamate, triethylenediaminiumisopropylcarbamate, benzylammonium benzylcarbamate, triethoxysilylprropylammonium triethoxysilylprropylcarbamate, and a derivative thereof, examples of the ammonium carbonate-based compound are ammonium carbonate, ethylammonium ethylcarbonate, isopropylammonium isopropylcarbonate, n-butylammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneimineammonium hexamethyleneiminecarbonate, morpholineammonium morpholinecarbonate, benzylammonium benzylcarbonate, triethoxysilylprropylammonium triethoxysilylprropylcarbonate, triethylenediaminiumisopropylcarbonate, and a derivative thereof, and examples of the ammonium bicarbonate-based compound are ammonium bicarbonate, isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridinium bicarbonate, triethylenediaminiumbicarbonate, and a derivative thereof. Examples of the phosphorous compound are mono(2-ethylhexyl)-2-ethylhexylphosphonate, bis (2-ethylhexyl)phosphate, bis(2-ethylhexyl)phosphite, and a phosphorous compound represented by $R_3P$ or $(RO)_3P$ wherein R represents an a $C_1$ to $C_{20}$ alkyl group or aryl group. Examples of the phosphorous compound are tributylphosphine, triphenylphosphine, triethylphosphite, and triphenylphosphite. Examples of the sulfur compound are butanethiol, n-hexanethiol, diethyl sulfide, and tetrahydrothiophene.

The Ag stabilizer may be dispersed in a solvent prior to use. The solvent may be, for example, water; alcohols, such as methanol, ethanol, isopropanol, 1-methoxypropanol, butanol, ethylhexyl alcohol, or terpineol; glycols, such as ethyleneglycol or glycerin; acetates, such as ethylacetate, butylacetate, methoxyprropylacetate, carbitol acetate, or ethylcarbitol acetate; ethers, such as methylcellosolve, butylcellosolve, diethylether, tetrahydrofurane, or dioxane; ketones, such as methylethylketone, acetone, dimethylformamide, or 1-methyl-2-pyrrolidone; a hydrocarbon-based solvent, such as hexane, heptane, dodecane, or paraffin oil; an aromatic solvent, such as benzene, toluene, or xylene; a halogen-substituted solvent, such as chloroform, methylenechloride, or carbontetrachloride; acetonitrile, dimethylsulfoxide, or a mixed solvent of these.

A current density of a current applied in order to perform the electrolytic plating is no more than 1 ASD, may be particularly in a range of about 0.2 ASD to about 0.7 ASD, and may be preferably in a range of about 0.3 ASD to about 0.5 ASD. When the current density of the current applied in order to perform the electrolytic plating is too high, a crystal grain density of the surface of the second plating layer 130 may be reduced and the void may occur in the second plating layer 130. To the contrary, when the current density of the applied current is too low, a plating speed is excessively low so that workability deteriorates.

The Sn crystal grain layer 140 may exist on the surface of the second plating layer 130. That is, when the surface of the second plating layer 130 is observed, a plurality of Sn crystal grains are concentrated and the average diameter of the Sn crystal grains is in a range of about 1 µm, to about 10 µm. When the average diameter of the Sn crystal grains is too small or large, the bumps of the solder balls are not sufficiently wetted by paste so that a head-in-pillow defect may easily occur and contact is defective.

At this time, diameters of the Sn crystal grains are defined as largest lengths of the corresponding Sn crystal grains and the average diameter of the Sn crystal grains may be obtained by performing image processing on the crystal grains of the surface of the second plating layer 130 by using software and may be calculated by counting the number of crystal grains that pass through a line segment of a predetermined length.

A surface of the Sn crystal grain layer 140 may be abraded by friction in accordance with a manufacturing method. That is, when plating is performed to form the second plating layer 130 while rotating the core ball 110 formed on the surface of the first plating layer 120 in a barrel, friction occurs between the solder balls so that surfaces of the solder balls may be abraded. In this case, the crystal grains may not be clearly seen only by observing the surfaces of the solder balls. When the crystal grains are not clearly seen since the solder balls are abraded, the abraded parts may be removed by surface ion etching using plasma to confirm a size and a shape of surface crystal grains.

In FIG. 1, the Sn crystal grain layer 140 is represented as a part of the surface of the second plating layer 130 and a part marked with a dotted line does not mean that an interface is formed.

Figure 2:
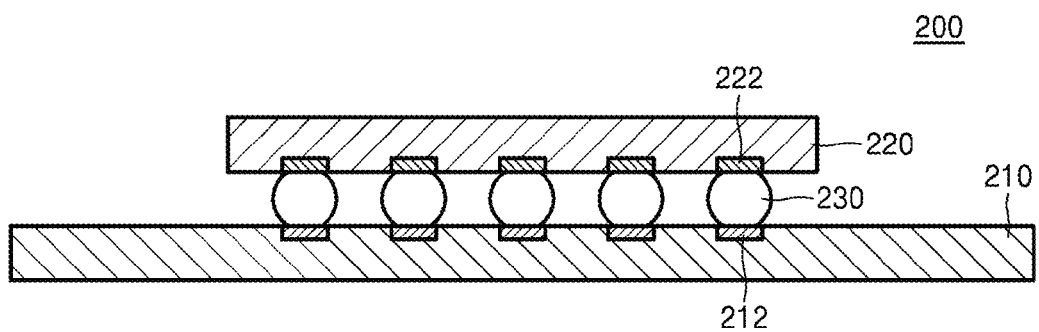
FIG. 2 illustrates a semiconductor part according to an exemplary embodiment.

According to one or more embodiments, a semiconductor part is provided. FIG. 2 illustrates a semiconductor part 200 according to an exemplary embodiment.

Referring to FIG. 2, a substrate 210 in which a plurality of first terminals 212 are formed is provided. The substrate 210 may be, for example, a printed circuit board (PCB) or a flexible PCB (FPCB).

The plurality of first terminals 212 may be bump pads with which bumps may be combined and may be formed of a single metal layer or may be formed by stacking a plurality of metals. In addition, the first terminals 212 may be formed of Cu, Al, Ni, or an alloy of two or more selected from Cu, Al, and Ni. However, the solder balls are not limited thereto.

A semiconductor device 220 having a plurality of second terminals 222 corresponding to the plurality of first terminals 212 may be mounted on the substrate 210. The semiconductor device 220 having the second terminals 222 may be, for example, a flash memory, a phase-change random access memory (PRAM), a resistive RAM (RRAM), a ferroelectric RAM (FeRAM), a magneto-resistive RAM (MRAM), a logic device, and a controller. However, the semiconductor device is not limited thereto. The flash memory may be, for example, a NAND flash memory. The semiconductor device 220 may be formed of one semiconductor chip and may be formed by stacking a number of semiconductor chips. In addition, the semiconductor device 220 may be one semiconductor chip and a semiconductor package in which a semiconductor chip is mounted on a package substrate and the semiconductor chip is encapsulated by an encapsulating material.

The plurality of first terminals 212 and the plurality of second terminals 222 corresponding to the plurality of first terminals 212 may be connected by solder bumps 230. At this time, the solder bumps 230 may be formed of the above-described Sn-based solder balls.

When the substrate 210 and the semiconductor device 220 are connected by the solder bumps 230, the solder balls have high sphericity and stand-off characteristics and connection reliability so that the semiconductor part 200 may be used for a semiconductor device having a high degree of integration.

Hereinafter, a configuration and effect are described in detail with reference to specific exemplary embodiments and comparative example. It should be understood that the exemplary embodiments should be considered in a descriptive sense only and not for purposes of limitation.

After preparing a plurality of Cu core balls each having a diameter of 180 µm, the prepared Cu core balls are washed by a reducing aqueous solution. A sulfuric acid aqueous solution of 10% concentration is used as a washing solution. In order to prevent surfaces of the Cu core balls from being damaged, a temperature of the sulfuric acid aqueous solution is controlled to be in a range of about 20° C. to about 25° C.

Then, a Ni layer as the first plating layer 120 is formed to a thickness of about 2±0.4 µm through the electrolytic plating. The thickness of the Ni layer is controlled by controlling a plating time. In particular, in order to obtain a smooth surface, a brightener widely used for Ni plating is not used.

In order to form a Sn—Ag—Cu alloy layer as the second plating layer 130, the electrolytic plating is performed on a plating tub where component metals are respectively controlled to have predetermined concentrations. At this time, an experiment is repeatedly performed while changing the concentration of the Ag stabilizer and the current density.

A distribution of $Ag_3Sn$, a composition of plating, and sphericity after reflow are measured while fixing the current density to about 0.5 ASD and changing concentration of ammonium carbonate as the Ag stabilizer.

The distribution of $Ag_3Sn$ is evaluated as X when the $Ag_3Sn$ IMC nanoparticles are concentrated on a specific radius section of the second plating layer 130, as Δ when the $Ag_3Sn$ IMC nanoparticles are not concentrated on the specific radius section of the second plating layer 130 and are distributed with a remarkable concentration gradient, as ○ when the concentration gradient is not recognized in a radius direction of the second plating layer 130 and there is a difference in size of the particles in accordance with the radius, and as ⊙ when there is no difference in concentration and particle size all over the second plating layer 130.

Compositions of respective components are obtained by Auger analysis. The sphericity after reflow is calculated by (a shortest diameter)/(a longest diameter) when the core balls are seen from above after reflowing the respective components at a temperature of about 320° C. and re-hardening the core balls.

The obtained results are displayed in TABLE 1.

TABLE 1

| | Component metal (M) | | | Ag stabilizer | Current density | $Ag_3Sn$ | Plating | Sphericity after |
|---|---|---|---|---|---|---|---|---|
| | Sn | Ag | Cu | (conc., M) | (ASD) | Distrib. | Comp. | reflow |
| Exemplary Embodiment 1 | 0.25 | 0.001 | 8.00E−05 | Ammonium carbonate (0.01) | 0.5 | ○ | Sn—2,3Ag—0.6Cu | 0.95 |

TABLE 1-continued

| | Component metal (M) | | | Ag stabilizer | Current density | Ag$_3$Sn | Plating | Sphericity after |
|---|---|---|---|---|---|---|---|---|
| | Sn | Ag | Cu | (conc., M) | (ASD) | Distrib. | Comp. | reflow |
| Exemplary Embodiment 2 | 0.25 | 0.001 | 8.00E−05 | Ammonium carbonate (0.03) | 0.5 | ◎ | Sn—2,4Ag—0.6Cu | 0.96 |
| Exemplary Embodiment 3 | 0.25 | 0.001 | 8.00E−05 | Ammonium carbonate (0.07) | 0.5 | ◎ | Sn—2,5Ag—0.7Cu | 0.97 |
| Exemplary Embodiment 4 | 0.25 | 0.001 | 8.00E−05 | Ammonium carbonate (0.5) | 0.5 | ◎ | Sn—2,6Ag—0.7Cu | 0.97 |
| Comparative Example 1 | 0.25 | 0.001 | 8.00E−05 | Ammonium carbonate (0.005) | 0.5 | Δ | Sn—2,2Ag—0.6Cu | 0.92 |
| Comparative Example 2 | 0.25 | 0.001 | 8.00E−05 | | 0.5 | X | Sn—2,0Ag—0.4Cu | 0.9 |
| Comparative Example 3 | 0.25 | 0.001 | 8.00E−05 | Ammonium carbonate (0.1) | 0.5 | Δ | Sn—2,6Ag—0.7Cu | 0.93 |

Figure 3A:
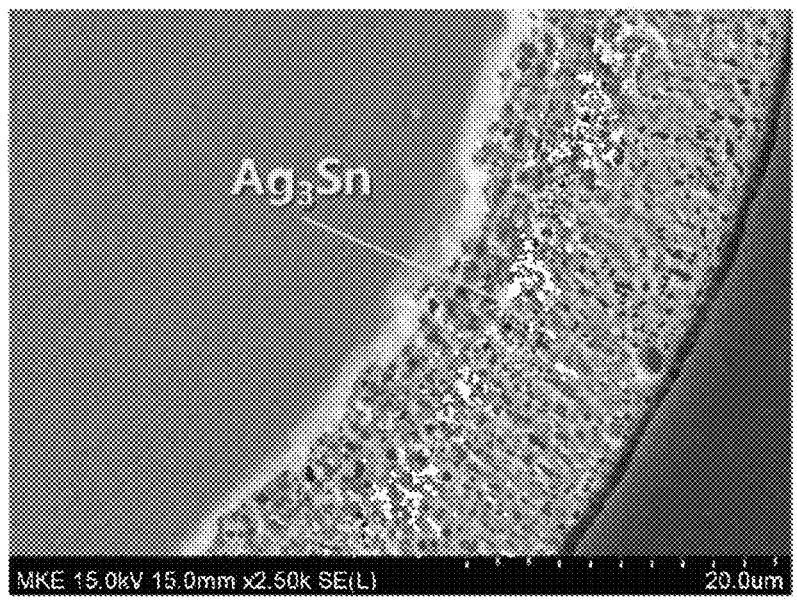
FIGS. 3A and 3B are electron microscope photographs illustrating a part of a cross-section of the solder ball of a comparative example 2.
Figure 3B:
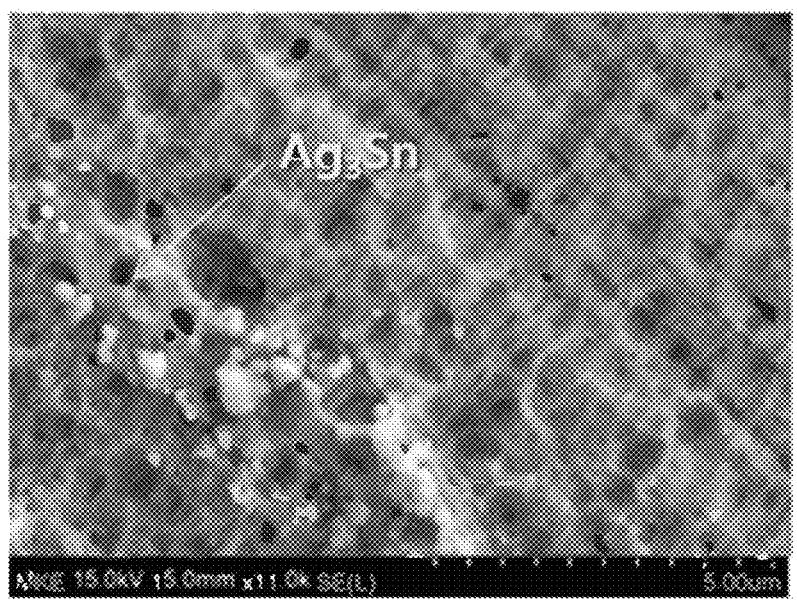
Figure 4A:
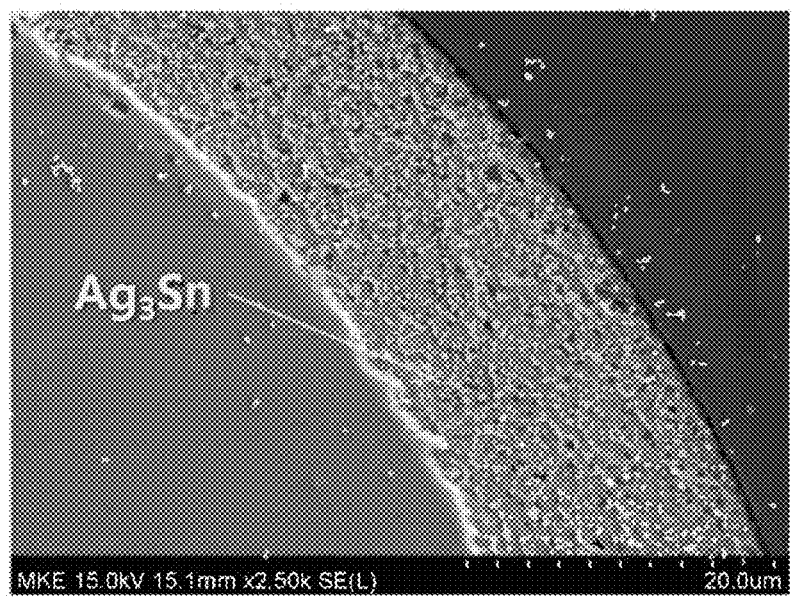
FIGS. 4A and 4B are electron microscope photographs illustrating a part of a cross-section of the solder ball of an exemplary embodiment 2.
Figure 4B:
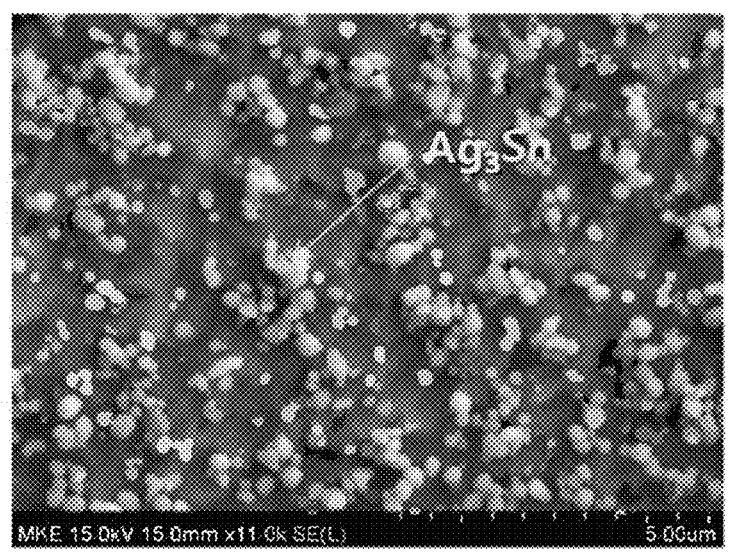

As illustrated in the TABLE 1, when the Ag stabilizer is not added (Comparative Example 2), the distribution of Ag$_3$Sn is very defective. As a result, the sphericity after reflow is about 0.9, which is very defective. FIGS. 3A and 3B are electron microscope photographs illustrating a part of a cross-section of the solder ball of Comparative Example 2, in which Ag$_3$Sn exists only in a partial region of the second plating layer 130. FIGS. 4A and 4B are electron microscope photographs illustrating a part of a cross-section of the solder ball of Exemplary Embodiment 2, in which Ag$_3$Sn is uniformly distributed all over the region of the second plating layer 130.

Figure 5:
FIG. 5 is an enlarged photograph illustrating that the solder balls of a comparative example 1 are bridged after reflow.
Figure 6:
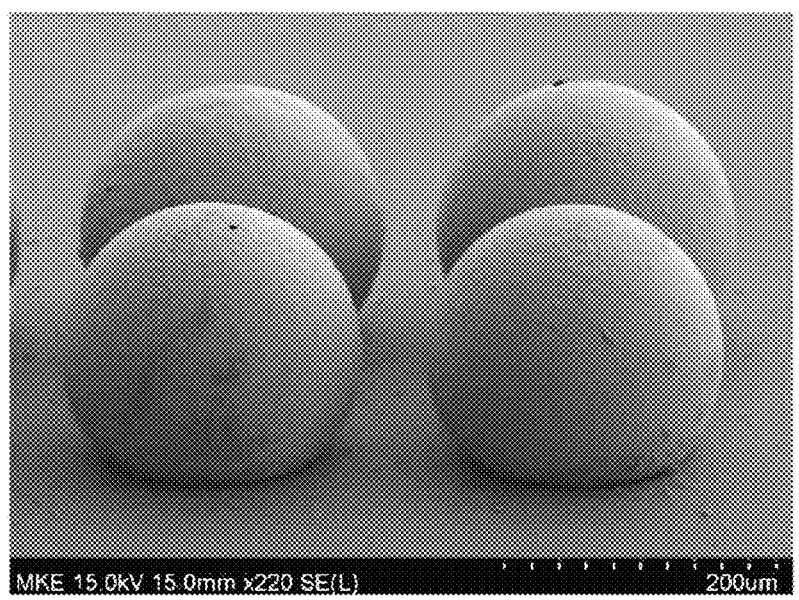
FIG. 6 is an enlarged photograph illustrating that the solder balls of an exemplary embodiment 3 maintain high sphericity after reflow.

In addition, although the Ag stabilizer is added, when an amount of the Ag stabilizer is not sufficient (Comparative Example 1), the distribution of Ag$_3$Sn is not good. As a result, the sphericity after reflow is about 0.92, which is not good. FIG. 5 is an enlarged photograph illustrating that the solder balls of Comparative Example 1 are bridged after reflow. FIG. 6 is an enlarged photograph illustrating that the solder balls of Exemplary Embodiment 3 maintain high sphericity after reflow.

To the contrary, when the Ag stabilizer is excessively added (Comparative Example 3), like in Comparative Example 1, the distribution of Ag$_3$Sn is not good. As a result, the sphericity after reflow is about 0.93, which is not good. The reason why the distribution of Ag$_3$Sn is not good although the Ag stabilizer is sufficiently added is because the composition of the plating tub rapidly changes, which is assumed considering that a color of the plating tub rapidly changes when plating is performed. However, the solder balls are not limited to a specific theory.

Then, while fixing the concentration of the Ag stabilizer to about 0.07 M and changing the current density, the thickness of the second plating layer plated for about five minutes and an average diameter of the surface Sn crystal grains are measured. Due to friction between the solder balls, the surface Sn crystal grains may not be immediately observed. After removing the surfaces of the solder balls in a range of about several nm to about several decades nm through plasma processing, the surface Sn crystal grains may be observed. The results are displayed in TABLE 2.

TABLE 2

| | Component metal (M) | | | Ag stabilizer | Current density | Average diameter of surface Sn | Sphericity after |
|---|---|---|---|---|---|---|---|
| | Sn | Ag | Cu | (concentration, M) | (ASD) | crystal grains | reflow |
| Exemplary Embodiment 5 | 0.25 | 0.001 | 8.00E−05 | Ammonium carbonate (0.07) | 0.1 | 1.2 | 16 |
| Exemplary Embodiment 6 | 0.25 | 0.001 | 8.00E−05 | Ammonium carbonate (0.07) | 0.2 | 2.2 | 23 |
| Exemplary Embodiment 3 | 0.25 | 0.001 | 8.00E−05 | Ammonium carbonate (0.07) | 0.5 | 6.7 | 27 |
| Exemplary Embodiment 7 | 0.25 | 0.001 | 8.00E−05 | Ammonium carbonate (0.07) | 0.7 | 8.8 | 30 |
| Exemplary Embodiment 8 | 0.25 | 0.001 | 8.00E−05 | Ammonium carbonate (0.07) | 1 | 9.7 | 32 |
| Comparative Example 4 | 0.25 | 0.001 | 8.00E−05 | Ammonium carbonate (0.07) | 0.05 | | 7 |
| Comparative Example 5 | 0.25 | 0.001 | 8.00E−05 | Ammonium carbonate (0.07) | 2 | 13.3 | 35 |

Figure 7A:
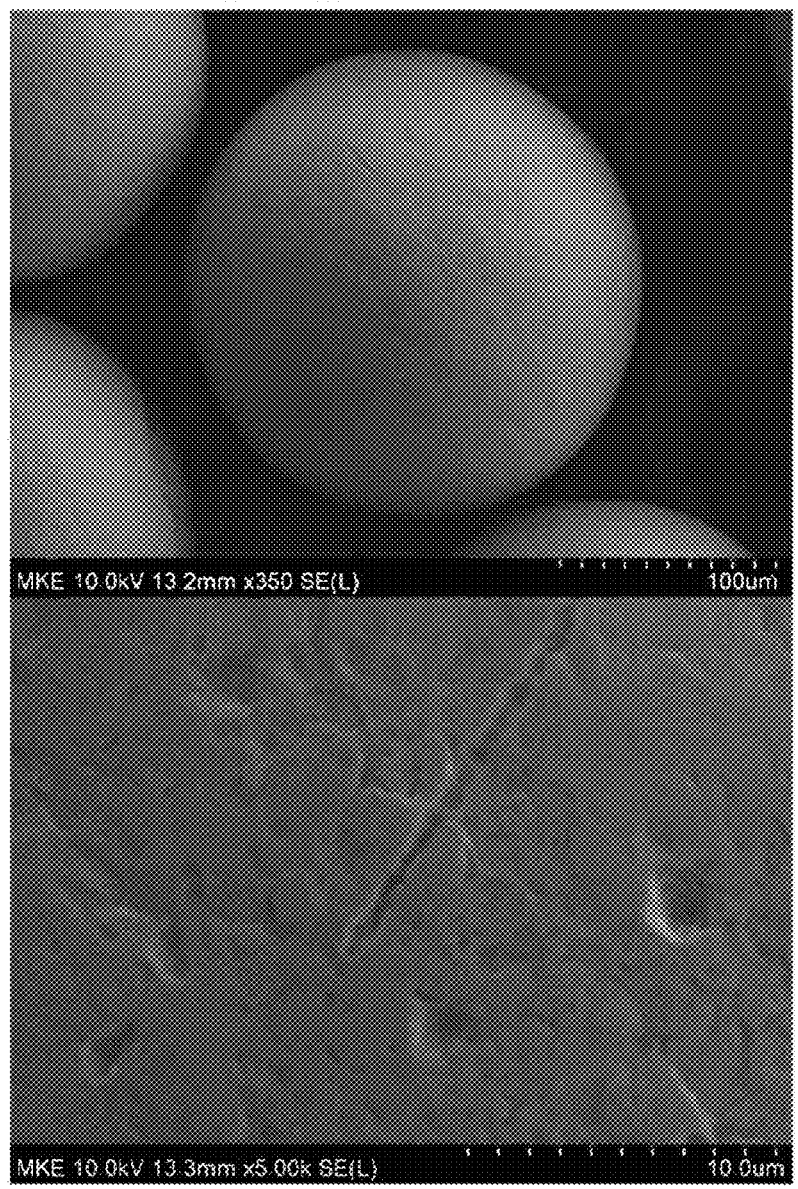
FIG. 7A is an electron microscope photograph illustrating an enlarged surface of the solder ball of a comparative example 4.
Figure 8A:
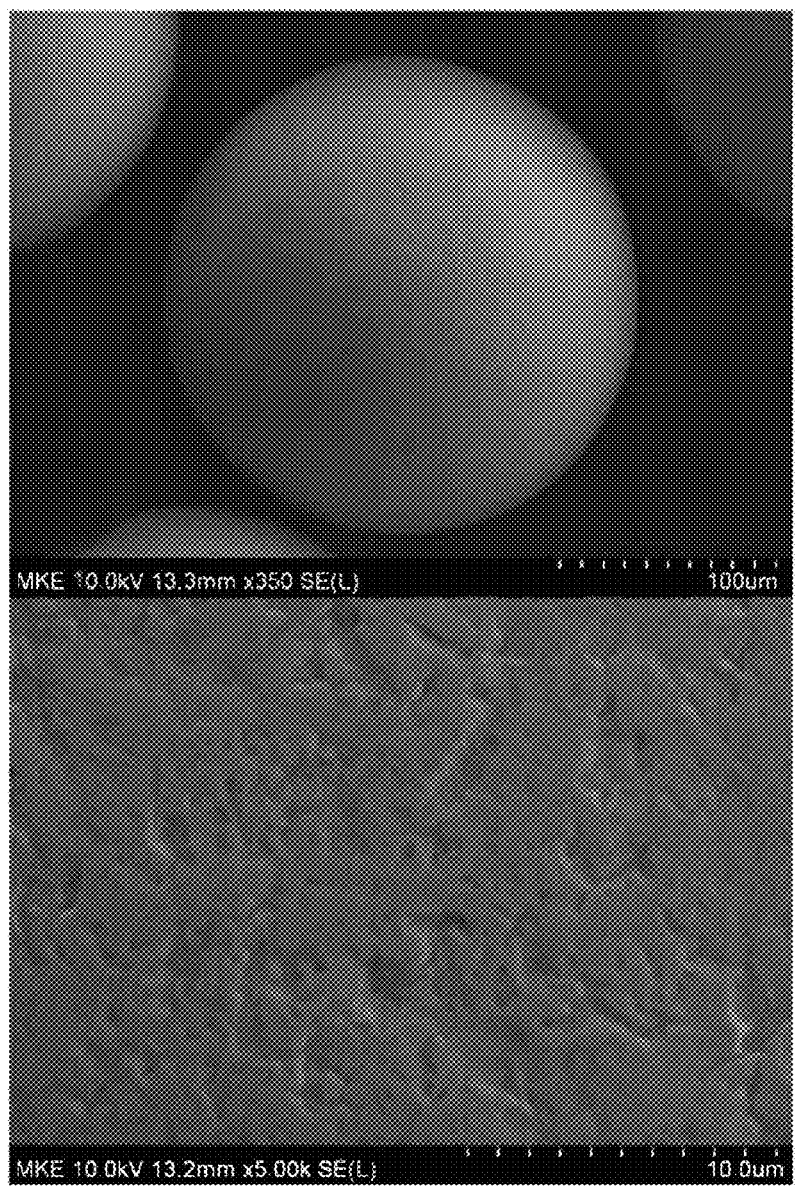
FIG. 8A is an electron microscope photograph illustrating an enlarged surface of the solder ball of an exemplary embodiment 7.

As illustrated in the TABLE 2, when the current density of the applied current is about 0.05 ASD, the thickness of the second plating layer plated for about five minutes is only about 7 μm so that workability remarkably deteriorates and the surface Sn crystal grains are not observed. FIGS. 7A and 8A are electron microscope photographs illustrating enlarged surfaces of the solder balls of Comparative Example 4 and Comparative Example 7. As illustrated in FIGS. 7A and 8A, the solder balls are abraded in manufacturing processes so that the surface Sn crystal grains are not observed.

Figure 7B:
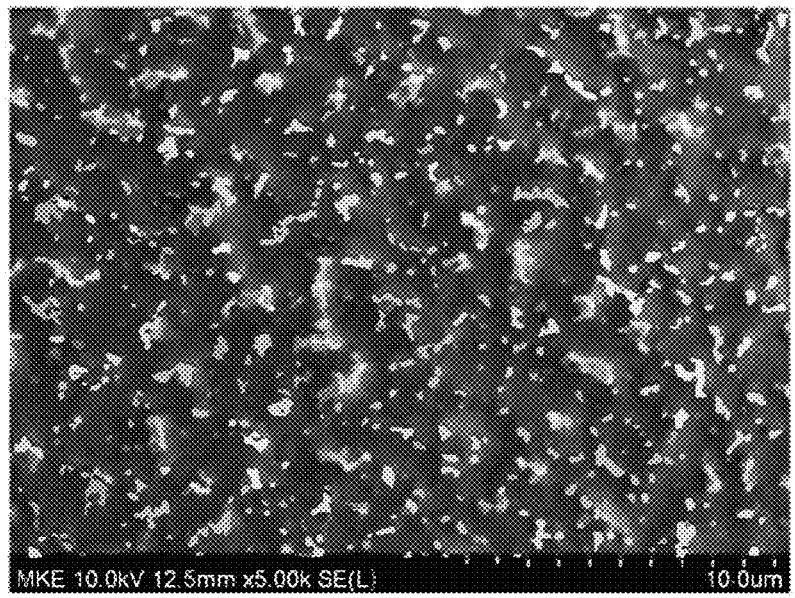
FIG. 7B is an electron microscope photograph illustrating a surface of the solder ball of FIG. 7A after being plasma ion processed.
Figure 8B:
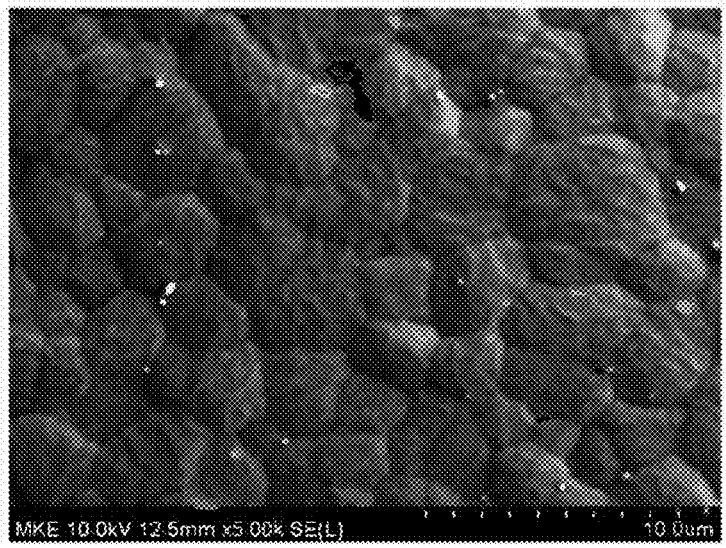
FIG. 8B is an electron microscope photograph illustrating a surface of the solder ball of FIG. 8A after being plasma ion processed.

FIGS. 7B and 8B are electron microscope photograph illustrating surfaces of the solder balls of FIGS. 7A and 8A after being plasma ion processed. In FIG. 7B, only the Ag$_3$Sn particles are observed and the surface Sn crystal grains are not observed. However, in FIG. 8B, the surface Sn crystal grains are observed. When the solder balls of Comparative Example 4 are applied to a surface mounting package, the head-in-pillow occurs, which is estimated because the plurality of Ag$_3$Sn IMC particles exposed to the surfaces of the solder balls prevents the solder balls from being wetted by the paste.

In addition, when the current density of the applied current is 2 ASD, the thickness of the second plating layer plated for about five minutes is about 35 μm so that workability is high. However, the average diameter of the surface Sn crystal grains is about 13.3 μm and a void is found in partial surfaces of the solder balls.

The solder balls have high sphericity and stand-off characteristics and connection reliability so that the semiconductor device having the high degree of integration may be implemented.

While one or more embodiments have been described with reference to the figures, it will be understood by those of ordinary skill in the art that various changes in form and details may be made therein without departing from the spirit and scope as defined by the following claims.

The invention claimed is:

1. A Sn-based solder ball in which a first plating layer and a second plating layer are sequentially formed on a core ball,
    wherein the second plating layer comprises a Sn—Ag—Cu alloy, and
    wherein $Ag_3Sn$ intermetallic compound (IMC) nanoparticles and/or Ag—Sn compound nanoparticles exist in the second plating layer.

2. The Sn-based solder ball of claim 1, wherein the $Ag_3Sn$ IMC nanoparticles and/or the Ag-Sn compound nanoparticles are uniformly distributed all over the second plating layer.

3. The Sn-based solder ball of claim 2, wherein an average diameter of the $Ag_3Sn$ IMC nanoparticles and/or the Ag-Sn compound nanoparticles is in a range of about 0.06 μm to about 1.8 μm.

4. The Sn-based solder ball of claim 1, wherein sphericity after reflow of the solder ball is no less than about 0.95.

5. The Sn-based solder ball of claim 1, wherein the second plating layer comprises Ag in an amount in the range of about 0.5 wt % to about 4 wt % and Cu in an amount of no more than about 1.5 wt %.

6. The Sn-based solder ball of claim 5, wherein the second plating layer excludes Cu.

7. The Sn-based solder ball of claim 5, wherein the second plating layer is formed of Ag in an amount in a range of about 2.5 wt % to about 3.5 wt %, Cu in an amount in a range of about 0.4 wt % to about 1.2 wt %, Sn as a remainder, and other inevitable impurities.

8. The Sn-based solder ball of claim 1, further comprising a Sn crystal grain layer on a surface of the second plating layer,
    wherein an average diameter of Sn crystal grains of the Sn crystal grain layer is in a range of about 1 μm to about 10 μm.

9. A semiconductor part, comprising:
    a substrate in which a plurality of first terminals are formed;
    a semiconductor device mounted on the substrate and having a plurality of second terminals corresponding to the plurality of first terminals; and
    solder bumps for respectively connecting the first terminals and the second terminals, wherein the solder bumps are the Sn-based solder balls of claim 1.

10. A Sn-based solder ball in which a first plating layer and a second plating layer are sequentially formed on a core ball,
    wherein the second plating layer comprises a Sn—Ag—Cu alloy, and
    wherein Ag—Sn compound nanoparticles exist in the second plating layer, and
    wherein the Ag—Sn compound nanoparticles are formed of Ag in a range of about 10 wt % to about 90 wt %, Sn in a range of about 90 wt % to about 10 wt %, and other inevitable impurities.

11. The Sn-based solder ball of claim 10, wherein the Ag—Sn compound nanoparticles are uniformly distributed all over the second plating layer.

* * * * *